(12) United States Patent
Derouffignac

(10) Patent No.: US 9,765,429 B2
(45) Date of Patent: Sep. 19, 2017

(54) GROWING FILMS VIA SEQUENTIAL LIQUID/VAPOR PHASES

(71) Applicant: President and Fellows of Harvard College, Cambridge, MA (US)

(72) Inventor: Philippe P. Derouffignac, Arlington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 14/916,481

(22) PCT Filed: Sep. 4, 2014

(86) PCT No.: PCT/US2014/054121
§ 371 (c)(1),
(2) Date: Mar. 3, 2016

(87) PCT Pub. No.: WO2015/035066
PCT Pub. Date: Mar. 12, 2015

(65) Prior Publication Data
US 2016/0215388 A1 Jul. 28, 2016

Related U.S. Application Data

(60) Provisional application No. 61/873,734, filed on Sep. 4, 2013.

(51) Int. Cl.
*C23C 16/24* (2006.01)
*B05D 3/10* (2006.01)
(Continued)

(52) U.S. Cl.
CPC ............... *C23C 16/24* (2013.01); *B05D 1/60* (2013.01); *B05D 3/101* (2013.01); *C23C 16/02* (2013.01); *B05D 7/02* (2013.01)

(58) Field of Classification Search
None
See application file for complete search history.

(56) References Cited

U.S. PATENT DOCUMENTS

| 4,105,810 A | 8/1978 | Yamazaki et al. |
| 4,481,328 A | 11/1984 | Harreus et al. |

(Continued)

FOREIGN PATENT DOCUMENTS

| WO | WO-95/28285 A1 | 10/1995 |
| WO | WO-2011/156484 A2 | 12/2011 |

OTHER PUBLICATIONS

International Search Report and Written Opinion mailed Nov. 19, 2014, in the International Application No. PCT/US14/54121, filed Sep. 4, 2014, 27 pages.

(Continued)

*Primary Examiner* — Joseph Miller, Jr.
(74) *Attorney, Agent, or Firm* — Wilmer Cutler Pickering Hale and Dorr LLP

(57) ABSTRACT

A method for depositing a film on a polymer substrate is disclosed. The method includes exposing a polymer substrate to a liquid comprising a first reactant to provide a plurality of reactive sites over the polymer substrate, wherein the first reactant comprises aluminum or boron; and introducing a second reactant comprising silicon in a vapor form to said plurality of reactive sites that provide a catalytic growth of the film, wherein the growth of the film is self-limited. In certain embodiments, the film can include silica, aluminum silicate, or borosilicate.

24 Claims, 3 Drawing Sheets

Schematic illustration of the reactions that occurs on the polymer substrate when depositing a silica film in accordance with the process steps of FIG. 2 in accordance with certain embodiments

(51) Int. Cl.
  *B05D 1/00* (2006.01)
  *C23C 16/02* (2006.01)
  *B05D 7/02* (2006.01)

(56) References Cited

U.S. PATENT DOCUMENTS

| | | | |
|---|---|---|---|
| 5,200,238 A | 4/1993 | McArdle et al. |
| 5,250,329 A | 10/1993 | Miracky et al. |
| 5,359,101 A | 10/1994 | Woods et al. |
| 5,691,062 A | 11/1997 | Shalaby et al. |
| 5,759,923 A | 6/1998 | McMillan et al. |
| 6,165,566 A | 12/2000 | Tropsha |
| 6,380,097 B1 | 4/2002 | Dauplaise et al. |
| 6,899,816 B2 | 5/2005 | Padhi et al. |
| 7,241,472 B2 | 7/2007 | Arai |
| 7,256,425 B2 | 8/2007 | Weinert et al. |
| 7,514,353 B2 | 4/2009 | Weidman et al. |
| 7,638,167 B2 | 12/2009 | Kobrin et al. |
| 7,737,047 B2 | 6/2010 | Hill |
| 8,008,743 B2 | 8/2011 | Gordon et al. |
| 2002/0173169 A1 | 11/2002 | Campana et al. |
| 2002/0177000 A1 | 11/2002 | Katsuki et al. |
| 2003/0007897 A1 | 1/2003 | Creasey |
| 2003/0034251 A1 | 2/2003 | Chikarmane et al. |
| 2003/0200925 A1 | 10/2003 | Vaartstra |
| 2004/0195659 A1* | 10/2004 | Grill ............ H01L 21/02126 257/632 |
| 2006/0204664 A1 | 9/2006 | Adegawa |
| 2006/0246217 A1 | 11/2006 | Weidman et al. |
| 2008/0032064 A1 | 2/2008 | Gordon et al. |
| 2011/0177327 A1 | 7/2011 | Jahromi et al. |
| 2012/0108418 A1 | 5/2012 | Nair et al. |
| 2012/0201959 A1* | 8/2012 | Choi ................ C23C 16/02 427/255.394 |
| 2013/0236641 A1 | 9/2013 | Aizenberg et al. |

OTHER PUBLICATIONS

Masuda et al., "Selective Deposition and Micropatterning of Titanium Dioxide on Self-Assembled Monolayers from a Gas Phase", Langmuir, vol. 17, pp. 4876-4880, (2001).

* cited by examiner

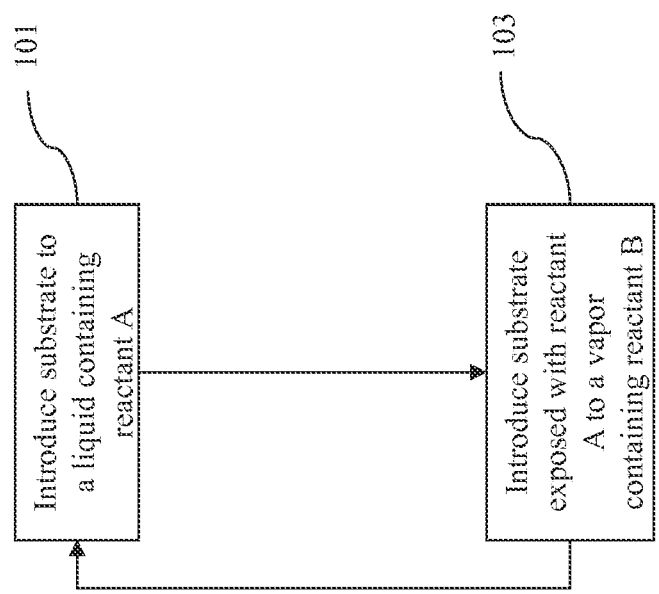
Fig. 1. Diagram of a sequential solution phase – vapor phase deposition reaction in accordance with certain embodiments

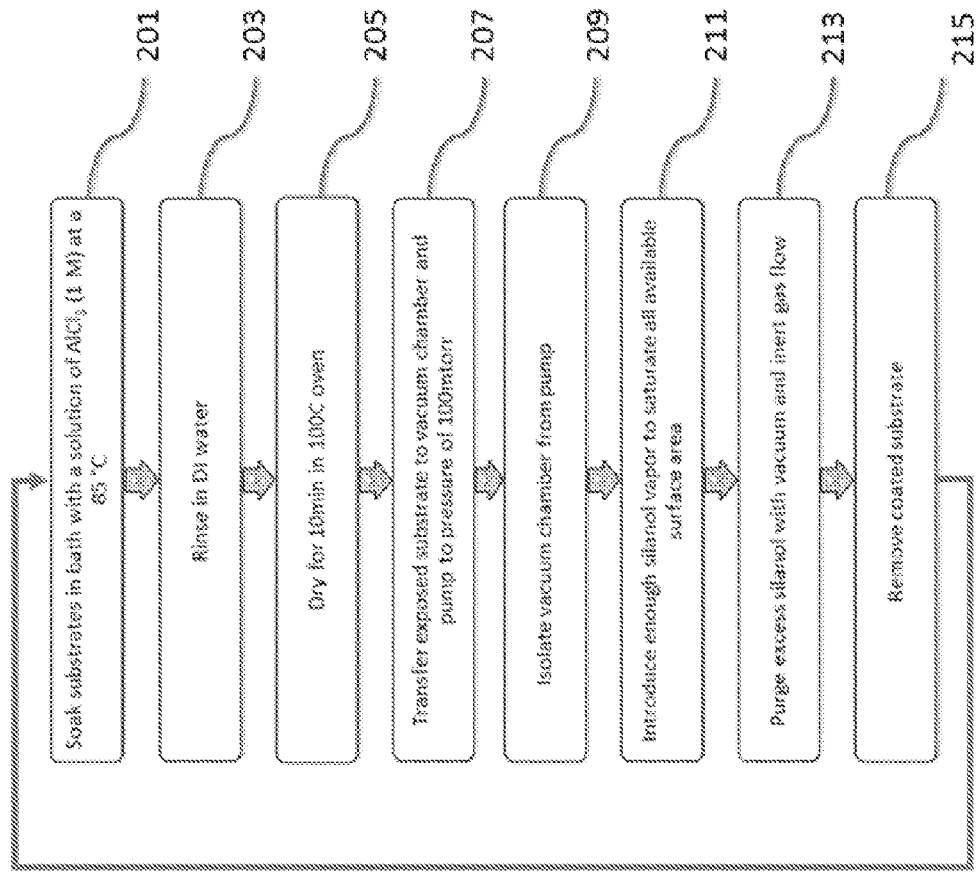
Fig. 2. Diagram of a particular sequential solution phase – vapor phase deposition reaction to deposit silica on a polymer substrate in accordance with certain embodiments

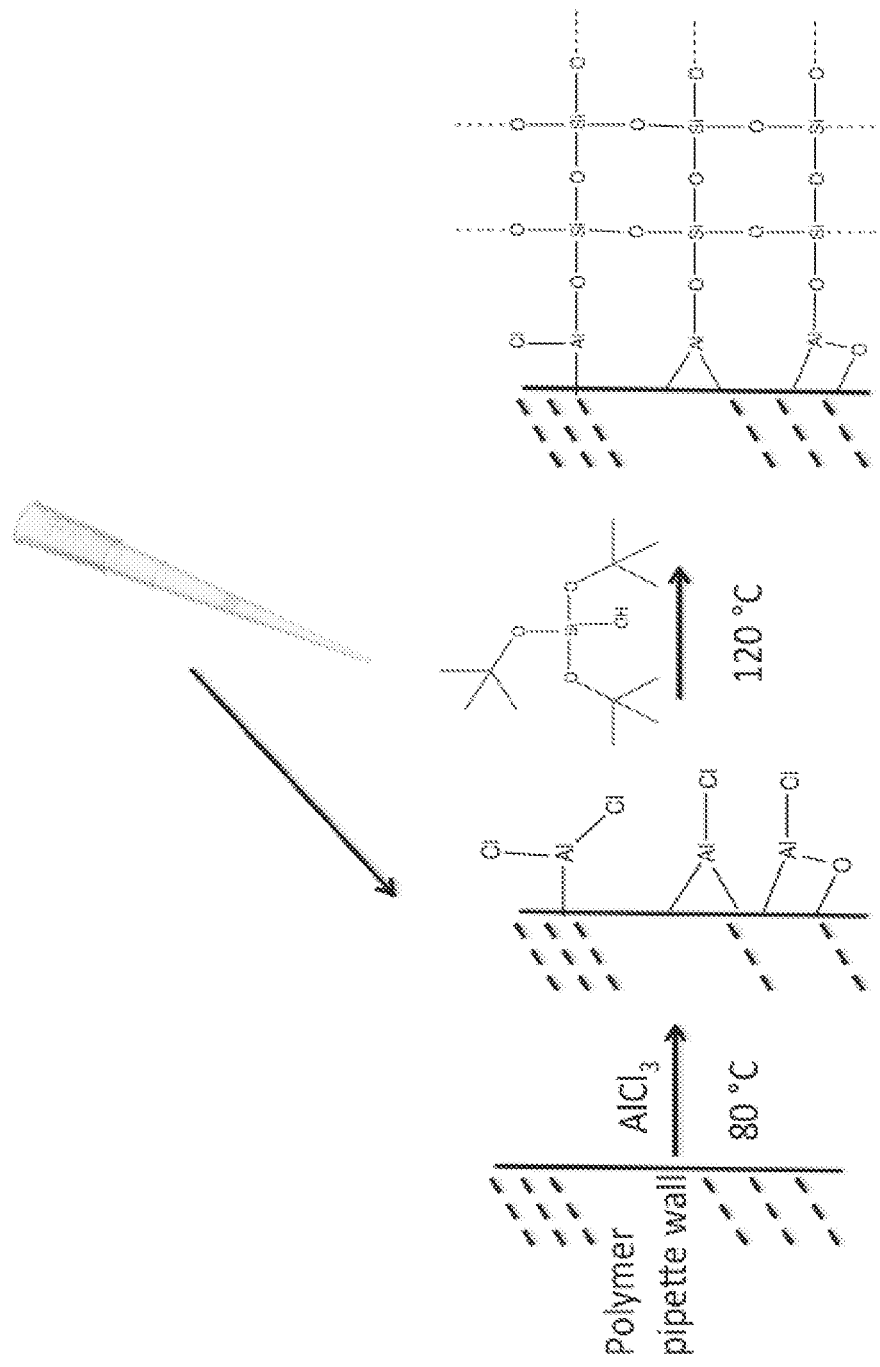
Fig. 3. Schematic illustration of the reactions that occurs on the polymer substrate when depositing a silica film in accordance with the process steps of FIG. 2 in accordance with certain embodiments

GROWING FILMS VIA SEQUENTIAL LIQUID/VAPOR PHASES

RELATED APPLICATIONS

This patent application is a National Stage Entry of PCT International Application No. PCT/US2014/054121 filed Sep. 4, 2014, which claims priority to U.S. Provisional Application No. 61/873,734 filed Sep. 4, 2013, the contents of which are incorporated by reference herein in their entirety.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

FIELD OF THE INVENTION

The present application relates to coating silica on many different types of surfaces. More particularly, the present application relates to coating silica on surfaces that require low temperature processing conditions, such as polymer substrates using reactants that are all stable in air, stable in water and relatively non-hazardous.

BACKGROUND

Current deposition techniques for growing silica uniformly and conformally on substrates rely on binary gas phase reactions, such as the following three combinations of reactants:

trimethylaluminum (TMA) alternately deposited with tris(tert)butoxyl silanol;

ammonia ($NH_3$) alternately deposited with tetramethoxysilane; or $H_2Si[N(C_2H_5)_2]_2$ alternately deposited with oxygen plasma.

However, these techniques suffer from certain limitations. First, alternating layer deposition techniques using binary gases deposit film on all exposed surfaces, requiring periodic maintenance/cleaning of the interior reaction chamber surfaces. Second, at least one of the reactants described above are either toxic (e.g., $NH_3$), explosive ($O_2$) or pyrophoric (TMA). Third, the byproducts, such as ammonia, methane, amides, and the like, from each of these vapor phase silica reactions must be handled with appropriate caution.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIG. 1 is a diagram of a sequential solution phase—vapor phase deposition reaction in accordance with certain embodiments;

FIG. 2 is a diagram of a particular sequential solution phase—vapor phase deposition reaction to deposit silica on a polymer substrate in accordance with certain embodiments; and FIG. 3 schematically illustrates the reactions that occur on the polymer substrate when depositing a silica film in accordance with the process steps of FIG. 2 in accordance with certain embodiments.

DETAILED DESCRIPTION

FIG. 1 shows a process for carrying out the process in accordance with certain embodiments of the present invention.

In step 101, a substrate is placed into a liquid that contains Reactant A. In certain embodiments, Reactant A reacts with the surface of the substrate, thereby forming a suitable reactive surface for the next deposition step. In other embodiments, Reactant A is physisorbed onto and/or into all exposed surfaces of the substrate and forms suitable reactive surface sites for the next deposition step. In certain embodiments, the exposure of the substrate with Reactant A provides reactive surface sites that allow catalytic growth when exposed to Reactant B in the next processing step.

In certain embodiments, step 101 can be carried out at a temperature between 20 and 95° C., such as 70-90° C. Such low temperatures allow the substrate to be made of polymers.

In certain embodiments, step 101 can be carried out between 1 second and 60 minutes, such as 5-10 minutes.

In certain embodiments, step 101 can be carried out by dipping a substrate into the liquid containing Reactant A. In certain embodiments, step 101 can be carried out by, spraying the substrate with a liquid containing Reactant A, such as in the form of droplets ranging from 10 nm to 0.1 mm in diameter, on the substrate surface. In certain embodiments, step 101 can be carried out by printing the liquid containing Reactant A onto the substrate surface, such as using an inkjet printer.

In step 103, the substrate that has been exposed to Reactant A is introduced into a sealed reaction chamber. Then, the substrate is exposed to a vapor of a Reactant B that reacts with the surface sites created in step 101 to produce a layer of film that after a given exposure stops growing even upon an excess presence of Reactant B. Hence, the reaction is a self-limiting reaction.

In certain embodiments, step 103 can be carried out at a temperature between 80° C. and 250° C., such as 110-150° C. In certain embodiments, the Reactant B is vaporized at a temperature which is lower than the temperature of the substrate. In certain embodiments, the temperature of the substrate is kept lower than the softening or melting point of said substrate but higher than the vaporization temperature of Reactant B so that such low temperatures allow the substrate to be made of polymers but high enough such that Reactant B does not condense on the surface of the substrate. In certain embodiments, the temperature of Reactant B can be kept between 20° C. and 130° C.

In certain embodiments, step 103 can be carried out in a sealed reaction chamber having a pressure between 0.1 mtorr and 100 torr. In certain embodiments, the pressure can be set as the base pressure achieved by a particular vacuum pumping system. In certain embodiments, the pressure can be set by introducing an inert gas into the reaction chamber at a controlled flow rate in combination with a particular vacuum pumping system.

In certain embodiments, Reactant B is introduced into a reaction chamber through a plurality of orifices that surround the substrate in all physical dimensions. In certain embodiments, Reactant B is introduced into a reaction chamber through a plurality of orifices that are located on one side of the reaction chamber. In certain embodiments, Reactant B is introduced into a reaction chamber through a single orifice.

In certain embodiments, exposure of Reactant B, which is defined as the product of the vapor pressure in the reaction chamber and the time exposed to the substrate, can be controlled by isolating the deposition chamber from the vacuum system when Reactant B is introduced into the chamber for a predetermined amount of time, such as 10-60 s. In certain embodiments, exposure of Reactant B can be controlled by increasing or decreasing the dose of Reactant B from its source by controlling the temperature, amount of time that Reactant B is introduced into the reaction chamber, controlling the flow rate of the inert gas carrier, or controlling the injection rate of a liquid delivery system.

In certain embodiments, substrate is stationary during step 103. In certain embodiments, the substrate is rotated during exposure of Reactant B.

In certain embodiments, steps 101 and 103 can be repeated as desired to produce thicker films.

Substrate

In certain embodiments, the substrate can be a polymer, such as polymethyl methacrylate (PMMA), polystyrene (PS), polycarbonate (PC), nylon, poly(butylene terephthalate) (PBT), poly(trimethylene terephthalate), low density polyethylene (LDPE), high density polyethylene (HDPE), polypropylene (PP), polyvinyl chloride (PVC), polytetrafluoroethylene (PTFE), polyacrylonitrile (PAN), polyimide, polyacrilonitrile, polybutadiene, aramids, polyurethane, polyethylene (PE), napthalate (PEN), epoxies, acrylonitrile butadiene styrene (ABS), polyetheretherketone (PEEK), polyetherimide (PEI), polyisobutylene, polyethersulfone, and chemically modified variations of these base polymers.

In certain embodiments, the substrate can be an inorganic material, such as pure semiconductors like Si and Ge, pure carbon (diamond and graphite), III-V semiconductors like GaP, GaAs, GaN, AN, AlP, InP, II-VI semiconductors like CdSe, CdS, ZnO, ZnSe, insulating ceramics like $Al_2O_3$, $TiO_2$, $Si_3N_4$, $ZrO_2$, and metals/alloys like Fe, Ni, Cu, Mo, W, Au, Pt, etc. In certain embodiments, the substrate can be a porous inorganic material.

In certain embodiments, the substrate can be a powder, such as any of the materials and material classes described above. Powders can have average particle sizes from 1 nm to 0.1 mm. Particles can be solid or porous, aggregated into clumps or fully divided. Powders can be held static within the deposition system or be rolled or agitated during the deposition step.

In certain embodiments, the substrate can be a fiber, such as any of the materials and material classes mentioned in the two preceding paragraphs. Fibers can have average diameters from 1 nm to 0.1 mm and lengths from 1 nm to 1 m.

In certain embodiments, the substrate can have Reactant A embedded within the bulk of the substrate during the creation of the substrate. In certain embodiments, Reactant A embedded within the bulk of the substrate can diffuse to the outer surface of the substrate upon application of sufficient temperature and/or other stimuli. In certain embodiments, Reactant A can diffuse to the outer surface of the film that has formed after having been exposed to Reactant B as described above upon application of sufficient temperature and/or other stimuli.

Reactant A

In certain embodiments, Reactant A is a liquid. In certain embodiment, Reactant A is provided as a solute within a solution. In certain embodiments, the solution is an aqueous solution. In other embodiments, the solution is an organic solution. In certain embodiments, the solution is a mixture of an organic solvent, water, and Reactant A.

In certain embodiments, Reactant A can include compounds that have at least some solubility in aqueous or non-aqueous solution.

In certain embodiments, Reactant A can provide certain reactive species that provide catalytic growth of the film to be deposited upon exposure to Reactant B. As used herein, "catalytic growth" refers to growth that continues as long as the reactive species is accessible to Reactant B. In some embodiments, "catalytic growth" refers to growth that is not self-limited at a monomolecular layer as in traditional ALD, but growth that can occur over many layers. In certain embodiments, "catalytic growth" refers to growth that exceeds 1 nm, 5 nm, 10 nm or even about 20 nm thickness. In certain embodiments, Reactant A provides aluminum ions upon solvation or dissolution. In certain embodiments, Reactant A provides boron ions upon solvation or dissolution. In certain embodiments, Reactant A provides ions that are Lewis acids such as indium, titanium, cerium, scandium, magnesium, calcium, vanadium, iron, cobalt, nickel, manganese, copper, lanthanum, hafnium or any other ion from the list of elements in groups 1-13 of the periodic table.

Some exemplary Reactant A include aluminum acetate, aluminum chlorate, aluminum chlorate nonahydrate, aluminum chloride, aluminum chloride hexahydrate, aluminum hydroxy chloride, aluminum fluoride, aluminum iodide hexahydrate, aluminum lactate, aluminum nitrate, aluminum nitrate nonahydrate, aluminum sodium bis(sulfate) dodecahydrate, sodium aluminum sulfate dodecahydrate, aluminum perchlorate hexahydrate, aluminum sulfate, aluminum sulfate octadecahydrate, aluminum sulfate octadecahydrate, aluminum potassium bisulfate dodecahydrate, boric acid, boron oxide, boron trifluoride, or the like, or combinations thereof. Other soluble salts of the Lewis acid elements described above can also be utilized.

Reactant B

In certain embodiments, Reactant B is a vapor at the temperatures where step 103 is carried out. In certain embodiments, Reactant B is provided as a solid and vaporized or nebulized during step 103. In certain embodiments, Reactant B is provided as a liquid and vaporized or nebulized during step 103. In certain embodiments, Reactant B is provided as a solute within a solution. In certain embodiments, the solution is an aqueous solution. In other embodiments, the solution is an organic solution. In certain embodiments, the solution is a mixture of an organic solvent, water, and Reactant B.

In certain embodiments, Reactant B can catalytically react with the reactive species that form on the surface of the substrate after exposure to Reactant A. Reactant B can catalytically grow to form a film until the reactive sites formed on the surface of the substrate after exposure to Reactant A have been consumed and/or rendered inaccessible by the growth of the film.

Some exemplary Reactant B include silanols, such as alkoxysilanols, alkoxyalkylsilanols, alkoxysilanediols, or the like, or combinations thereof. For example, tris(tert-butoxy)silanol, tris(sec-butoxy)silanol. tris(iso-butoxy)silanol, tris(2-methyl-2-butoxy)silanol, tris(tert-pentoxy)silanol, tris(neo-pentoxy)silanol, tris(pentan-3-oxy)silanol, tris(cyclopentoxy)silanol, tris(isopropoxy)silanol, tris(ethoxy)silanol or the like, or combinations thereof can be utilized.

Deposited Film

In certain embodiments, reaction of Reactant A and Reactant B can form a silica film over the substrate. For example, $SiO_2$, $SiO_x$, where x ranges from 1.5 to 2.5, and the like can be deposited.

In certain embodiments, reaction of Reactant A and Reactant B can form an aluminum silicate film over the substrate. For example, $Al_xSiO_y$, where x ranges from 0.01 to 1, y ranges from 1.5 to 4 and the like can be deposited.

In certain embodiments, reaction of Reactant A and Reactant B can form an borosilicate film over the substrate. For example, $B_xSiO_y$, where x ranges from 0.01 to 1, y ranges from 1.5 to 4 and the like can be deposited.

Advantages

The solution phase—vapor phase reactions described herein provide additional benefits over other techniques. First, the deposited film only forms on the substrate and not on any other surfaces, such as the reaction chambers, because only the substrate is provided with Reactant A during the solution processing. Hence, periodic maintenance/cleaning of the interior reaction chamber surfaces is not needed. Second, contrary to the conventional vapor phase ALD techniques for growing silicon containing films, Reactant A and Reactant B can be selected so that both are not toxic, explosive, pyrophoric and are stable upon exposure to air. A third advantage is that the solution phase half of the reactions allows for the simultaneous exposure of other compounds that can act to make the substrate surface more amenable to growth such as polymer softening agents or polymer etchants. The modification of surfaces with these types of compounds is generally not compatible with vapor phase, low pressure deposition techniques.

EXAMPLES

Example 1

There are no polymer pipettes or disposable pipette tips currently manufactured that are chemically inert and stable in contact with all organic liquids Silica coated pipettes/tips would be compatible with all organics and would thus reduce the number of types of pipette tips that would need to be stocked in biological and chemical laboratories significantly.

Polymer vessels, pipettes, well plates and containers all have the potential to contaminate liquids in contact with the polymer given the tendency of polymers to leach chemicals into solutions that are in contact. The extant of leaching and the effect those contaminants can have cover a large range of possibilities from no measurable contaminants to levels that cause adverse cellular response. For example, bisphenol A, a compound known to leach from many plastics, has been shown to interrupt hormonal pathways in humans in lab tests. A silica coating grown under conditions described herein can act to reduce or eliminate leaching of compounds from polymers and thus prevent contamination of liquids being transferred or stored in polymer vessels made from any type of polymer.

FIG. 2 provides an exemplary process flow that can be utilized to deposit silica onto a polymer substrate, such as a polymer pipette tips. As shown, the substrate can be soaked in a solution bath of $AlCl_3$ (1M) at 85° C. (step 201). Then, the soaked substrates can be rinsed in DI water (step 203) and dried for about 10 minutes in a 100° C. oven (step 205). The dried substrate can be transferred to a vacuum chamber and pumped to a pressure of 100 mtorr (step 207). The vacuum chamber can then be isolated from the vacuum pump (step 209) and a sufficient amount of silanol vapor can be introduced to saturate all available surface area (step 211). The excess silanol can then be purged with a vacuum and inert gas flow (step 213) and the coated substrate can be removed (step 215). In desired, steps 201 through 215 can be repeated as desired.

As shown in FIG. 3, one exemplary substrates that can be deposited in accordance with the process steps shown in FIG. 2 include disposable pipette tips coated with a silica film. As shown, the polymer pipette tip can be provided a silica film as shown in FIG. 3. The conformal silica deposition method mentioned above would transform the polymer surface to a chemically resistant $SiO_2$ surface Upon review of the description and embodiments provided herein, those skilled in the art will understand that modifications and equivalent substitutions may be performed in carrying out the invention without departing from the essence of the invention. Thus, the invention is not meant to be limiting by the embodiments described explicitly above.

What is claimed is:

1. A method for depositing a film on a polymer substrate, the method comprising:
   providing a polymer substrate comprising a first reactant to provide a plurality of reactive sites over the polymer substrate, wherein the first reactant comprises aluminum or boron; and
   introducing a second reactant comprising silicon in a vapor form to said plurality of reactive sites that provide a catalytic growth of the film, wherein the growth of the film is self-limited,
   wherein the first reactant is provided within a bulk of the polymer substrate and is diffused out to the surface of the polymer substrate.

2. The method of claim 1, wherein the first reactant comprises aluminum acetate, aluminum chlorate, aluminum chlorate nonahydrate, aluminum chloride, aluminum chloride hexahydrate, aluminum hydroxy chloride, aluminum fluoride, aluminum iodide hexahydrate, aluminum lactate, aluminum nitrate, aluminum nitrate nonahydrate, aluminum sodium bis(sulfate) dodecahydrate, sodium aluminum sulfate dodecahydrate, aluminum perchlorate hexahydrate, aluminum sulfate, aluminum sulfate octadecahydrate, aluminum sulfate octadecahydrate, aluminum potassium bisulfate dodecahydrate, boric acid, boron oxide, boron trifluoride, other soluble salts of those elements considered to act as a Lewis acid or the like, or combinations thereof.

3. The method of claim 1, wherein the first reactant is provided on a surface of said polymer substrate.

4. The method of claim 1, wherein the second reactant comprises alkoxysilanols, alkoxyalkylsilanols, alkoxysilanediols, or combinations thereof.

5. The method of claim 1, wherein the second reactant comprises tris(tert-butoxy)silanol, tris(sec-butoxy)silanol, tris(iso-butoxy)silanol, tris(2-methyl-2-butoxy)silanol, tris(tert-pentoxy)silanol, tris(neo-pentoxy)silanol, tris(pentan-3-oxy)silanol, tris(cyclopentoxy)silanol, tris(isopropoxy)silanol, tris(ethoxy)silanol or combinations thereof.

6. The method of claim 1, wherein the polymer substrate comprises polymethyl methacrylate (PMMA), polystyrene (PS), polycarbonate (PC), nylon, poly(butylene terephthalate) (PBT), poly(trimethylene terephthalate), low density polyethylene (LDPE), high density polyethylene (HDPE), polypropylene (PP), polyvinyl chloride (PVC), polytetrafluoroethylene (PTFE), polyacrylonitrile (PAN), polyimide, polyacrilonitrile, polybutadiene, aramids, polyurethane, polyethylene (PE), napthalate (PEN), epoxies, acrylonitrile butadiene styrene (ABS), polyetheretherketone (PEEK), polyetherimide (PEI), polyisobutylene, polyethersulfone, and chemically modified variations of these base polymers or combinations thereof.

7. The method of claim 1, wherein the polymer substrate is a polymer pipette tip.

8. The method of claim 1, wherein the polymer substrate is a polymer vessel.

9. The method of claim 1, wherein the polymer substrate is a polymer tube.

10. The method of claim 1, wherein the polymer substrate is a polymer powder.

11. The method of claim 1, wherein the polymer substrate is a polymer fiber.

12. The method of claim 1, wherein the film comprises silica, aluminum silicate, or borosilicate.

13. A method for depositing a film on a polymer substrate, the method comprising:
providing a polymer substrate comprising a first reactant to provide a plurality of reactive sites over the polymer substrate, wherein the first reactant comprises aluminum or boron;
introducing a second reactant comprising silicon in a vapor form to said plurality of reactive sites that provide a catalytic growth of the film, wherein the growth of the film is self-limited; and
diffusing said first reactant through the film to a surface of said film,
wherein the second reactant comprises alkoxysilanols, alkoxyalkylsilanols, alkoxysilanediols, or a combination thereof.

14. The method of claim 13, further comprising sequentially repeating said diffusing and said introducing.

15. The method of claim 13, wherein the first reactant comprises aluminum acetate, aluminum chlorate, aluminum chlorate nonahydrate, aluminum chloride, aluminum chloride hexahydrate, aluminum hydroxy chloride, aluminum fluoride, aluminum iodide hexahydrate, aluminum lactate, aluminum nitrate, aluminum nitrate nonahydrate, aluminum sodium bis(sulfate) dodecahydrate, sodium aluminum sulfate dodecahydrate, aluminum perchlorate hexahydrate, aluminum sulfate, aluminum sulfate octadecahydrate, aluminum sulfate octadecahydrate, aluminum potassium bisulfate dodecahydrate, boric acid, boron oxide, boron trifluoride, other soluble salts of those elements considered to act as a Lewis acid or the like, or combinations thereof.

16. The method of claim 13, wherein the first reactant is provided on a surface of said polymer substrate.

17. The method of claim 13, wherein the second reactant comprises tris(tert-butoxy)silanol, tris(sec-butoxy)silanol, tris(iso-butoxy)silanol, tris(2-methyl-2-butoxy)silanol, tris(tert-pentoxy)silanol, tris(neo-pentoxy)silanol, tris(pentan-3-oxy)silanol, tris(cyclopentoxy)silanol, tris(isopropoxy)silanol, tris(ethoxy)silanol or combinations thereof.

18. The method of claim 13, wherein the polymer substrate comprises polymethyl methacrylate (PMMA), polystyrene (PS), polycarbonate (PC), nylon, poly(butylene terephthalate) (PBT), poly(trimethylene terephthalate), low density polyethylene (LDPE), high density polyethylene (HDPE), polypropylene (PP), polyvinyl chloride (PVC), polytetrafluoroethylene (PTFE), polyacrylonitrile (PAN), polyimide, polyacrilonitrile, polybutadiene, aramids, polyurethane, polyethylene (PE), napthalate (PEN), epoxies, acrylonitrile butadiene styrene (ABS), polyetheretherketone (PEEK), polyetherimide (PEI), polyisobutylene, polyethersulfone, and chemically modified variations of these base polymers or combinations thereof.

19. The method of claim 13, wherein the polymer substrate is a polymer pipette tip.

20. The method of claim 13, wherein the polymer substrate is a polymer vessel.

21. The method of claim 13, wherein the polymer substrate is a polymer tube.

22. The method of claim 13, wherein the polymer substrate is a polymer powder.

23. The method of claim 13, wherein the polymer substrate is a polymer fiber.

24. The method of claim 13, wherein the film comprises silica, aluminum silicate, or borosilicate.

* * * * *